United States Patent [19]

Lint et al.

[11] Patent Number: 5,015,981
[45] Date of Patent: May 14, 1991

[54] ELECTRONIC MICROMINIATURE PACKAGING AND METHOD

[75] Inventors: James D. Lint; Aurelio J. Gutierrez, both of San Diego, Calif.

[73] Assignee: Pulse Engineering, Inc., San Diego, Calif.

[21] Appl. No.: 570,894

[22] Filed: Aug. 21, 1990

[51] Int. Cl.[5] .................. H01F 17/02; H05K 7/02
[52] U.S. Cl. .......................... 336/65; 361/392; 361/404; 361/405; 361/417; 361/419; 361/421; 336/96; 336/192; 29/602.1; 29/854; 29/855
[58] Field of Search .............. 336/65, 96, 192, 229; 174/52.2, 52.4; 361/392, 393, 394, 396, 401, 421, 426

[56] References Cited

U.S. PATENT DOCUMENTS 4,748,405  5/1988  Brodzik et al. .................. 336/65

FOREIGN PATENT DOCUMENTS 119006  5/1989  Japan ................................ 336/65
119007  5/1989  Japan ................................ 336/65
955231  8/1982  U.S.S.R. ......................... 336/229

Primary Examiner—Leo P. Picard
Assistant Examiner—Michael Phillips
Attorney, Agent, or Firm—Baker, Maxham, Jester & Meador

[57] ABSTRACT

An electronic device having a plurality of leads comprises a three dimensional electronic element holder of a non-conducting material having at least one cavity therein and a plurality of lead slots extending from the cavity to a base of the holder, an electronic element mounted in the cavity and having a plurality of leads extending therefrom, a plurality of the leads extending within the slots from the element to the base, and a plurality of lead terminals mounted on the holder and each having one end extending into one of the slots into conducting engagement with a lead and a free end extending outward therefrom.

20 Claims, 2 Drawing Sheets

WIND WIRE 8 TURNS ±1 TURN AROUND EACH TERMINAL POST

ELECTRONIC MICROMINIATURE PACKAGING AND METHOD

BACKGROUND OF THE INVENTION

The present invention relates to non-semiconductor microminiature electronic elements and pertains particularly to an improved package and method of packaging of microminiature electronic components.

For many years, electronic circuit boards have been fabricated by interconnecting a plurality of electronic components, both active and passive, on a planar printed circuit board. Typically, this printed circuit board has comprised an Epoxy/fiberglass laminate substrate clad with a sheet of copper, which as been etched to delineate the conduct paths. Holes were drilled through terminal portions of the conductive paths for receiving electronic component leads which were subsequently soldered thereto.

More recently, so-called surface mount technology has evolved to permit more efficient automatic mass production of circuit boards with higher component densities. With this approach, certain packaged components are automatically placed at preselected locations on top of a printed circuit board so that their leads are registered with, and lie on top of corresponding solder paths. The printed circuit board is then processed by exposure to infrared or vapor phase soldering techniques to re-flow the solder and thereby establish a permanent electrical connection between the leads and their corresponding conductive paths on the printed circuit board.

Dual in-line chip carrier packages have existed for many years. The most common example is an integrated circuit, which is bonded to a ceramic carrier and electrically connected to a lead frame providing opposite rows of parallel electrical leads. The integrated circuit and ceramic carrier are normally encased in a black, rectangular plastic housing from which the leads extend. Typically, these dual in-line packages are mounted horizontally, i.e. with the leads extending co-planar with the printed circuit board. Such dual in-line packages have heretofore been attached to printed circuit boards by surface mounting techniques.

The increasing miniaturization of electrical and electronic elements and high density mounting thereof has created increasing problems with electrical isolation and mechanical interconnection. In particular, it creates more difficulty establishing reliable and efficient connection between fine gauge (AWG 24 to AWG 50) copper wires and egress hardware or terminals. Presently known interconnect methods severely limit the ability to provide density and reliable electrical and mechanical isolation between distinct egress or terminal points due to space limitations.

The prior art approach, as illustrated in FIG. 1, is to extend a fine copper wire 6 forming the element lead and to wrap or coil it around a terminal pin 8 of a terminal and apply solder to the connection. This requires space that is not always available and does not allow adequate separation for high voltages that may be required in the circuit. Another problem with this approach is that element leads are frequently broken or sheared during a subsequent encapsulation process. In addition, the lead is also frequently broken as the result of thermal expansion and contraction of the leads and/or terminals.

It is, therefore, desirable that an improved package and method of packaging of microminiature electronic components be available.

SUMMARY AND OBJECTS OF THE INVENTION

It is the primary object of the present invention to provide an improved package and method of packaging of microminiature electronic components.

In accordance with a primary aspect of the present invention, a miniature electronic device having a plurality of leads comprises a three dimensional electronic element holder of a non-conducting material, having at least one cavity therein and a plurality of lead slots extending from the cavity to a base of the holder, an electronic element mounted in the cavity, with a plurality of leads extending within slots from the element to the base, and a plurality of lead terminals mounted on the holder, and each having one end extending into and along one of the slots parallel to and into conducting engagement with a lead and a free end extending outward therefrom.

BRIEF DESCRIPTION OF THE DRAWING

The above and other objects and advantages of the present invention will become apparent from the following description when read in conjunction with the accompanying drawings wherein.

DETAILED DESCRIPTION OF A PREFERRED EMBODIMENT

Figure 2:
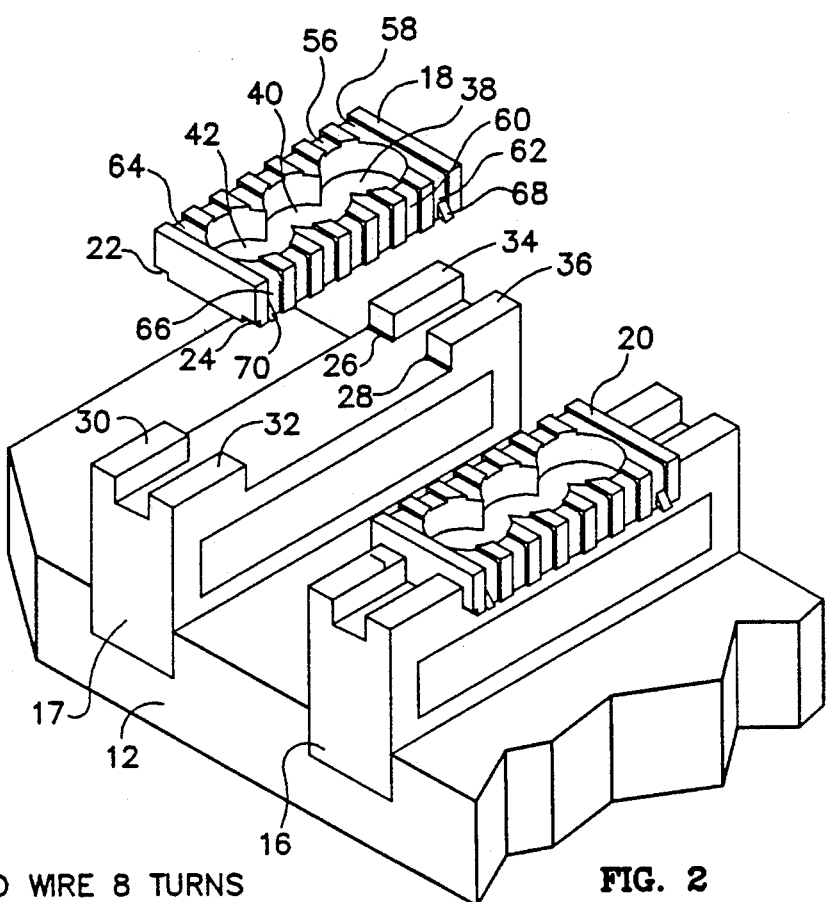
FIG. 2 is a perspective view illustrating major components and initial steps in assembling a preferred embodiment of the invention.
Figure 1:
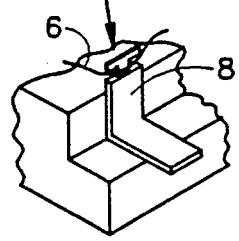
FIG. 1 is a perspective view illustrating the prior art.

Referring to FIG. 2 of the drawings, there is illustrated the beginning stages of the assembly of an electronic device in accordance with the invention. As illustrated in FIG. 2, an assembly fixture comprises a base 12 having a plurality of fixtures, only two of which are illustrated, 14 and 16, for receiving and mounting a plurality of electronic element housings or holders 18 and 20. The holder 18 is shown positioned above the fixture 14 in order to better illustrate the cooperative structure and relationship of the holder and fixture. The holder 20 is shown mounted in the fixture 16.

The holder 18 is of a generally rectangular box-like configuration, as illustrated, with a plurality of notches at each lower corner, only two of which are shown, 22 and 24 for cooperatively engaging similarly shaped bosses or plugs 26 and 28 at the bases of a plurality of upwardly extending blocks 30, 32, 34 and 36 which form a cradle within which the holder 18 is positioned and cradled.

Referring specifically to the holder or housing 18, it will be observed that it is formed with a recess formed in and extending downward from the top surface thereof, with the recess being formed of a plurality of overlapping cylindrical cavities or recesses 38, 40 and 42. The holder is designed to receive miniature or microminiature induction coils for establishing mounting and conductive terminals therefor. The holders or bases 18 and 20 are preferably constructed of a suitable molded non-conducting material, such as a high temperature liquid crystal polymer such as that available under the trademark XYDAR RC210. The material should have a temperature resistance of four-hundred ninety degrees Fahrenheit or higher for between three to ten seconds. The wall thickness of the holder should be on the order of about 0.015 inches minimum.

Figure 3:
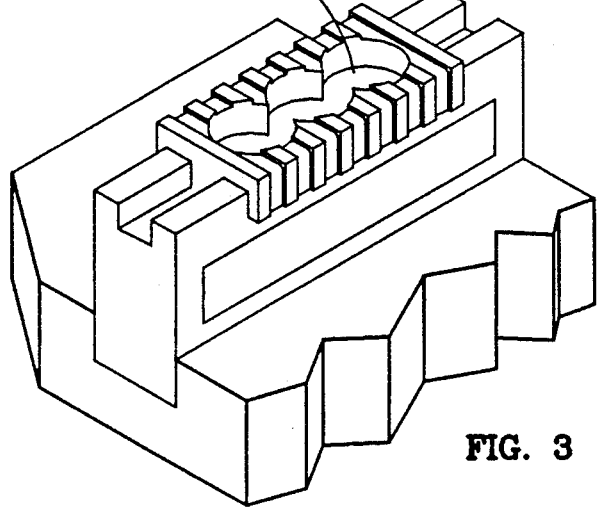
FIG. 3 is a perspective view illustrating additional major components and additional steps in assembling the invention.

An induction coil, as illustrated in FIG. 3 and designated by the numeral 44, comprises a doughnut shaped iron core member 46 around which are wrapped coils of thin gauge wire, with the ends of the wire extending outward forming terminal ends 48, 50, 52 and 54. In an exemplary embodiment, the iron ring member 46 is on the order of about three thirty seconds of an inch (3/32 in.) at its external diameter. The wires forming the coils may be on the order of twenty-four to fifty gauge (AWG 24 to AWG 50). The term AWG means American Wire Gauge, which is a means of specifying wire diameter. The higher the number, the smaller the wire diameter.

Referring again to FIG. 2, the cavities 38-42 in the holder 18 preferably have a depth exceeding the height of the coil. The holder is also provided with a plurality of slots or grooves which extend outward from the cavities 38-42 along the top surface and down the sides to the base of the holder. In the illustrated embodiment, each cavity for receiving a coil is provided with at least two slots or grooves on each side thereof, with an additional slot on each side extending between adjacent pairs of cavities. For example, cavity 38 is provided with a pair of slots 56 and 58 on one side, and a pair of slots 60 and 62 on the opposite side. The other cavities 40 and 42 are also provided with similar pairs of slots, with the end cavity 42 provided with a pair of end slots 64 and 66.

The end slots 58 and 62 on one end and 64 and 66 on the other end are each provided with latch members at the base thereof, only two of which are shown. The slots 62 and 66 have latch members 68 and 70 in the form of a wedge shaped ramp at one end and one side thereof, as will be more specifically detailed in FIG. 5. These provide latch dogs that cooperate with latch fingers or tabs on the end lead terminals of the lead frame for latching the lead frame in position during assembly, as will be more specifically described.

Referring now to FIG. 3, further details of the steps of assembly and structure will be described. After the holders 18 and 20 have been loaded into the fixtures, a small amount of a suitable bonding material, such as a silicone, glue or the like, is placed in the bottom of each of the cavities 38, 40 and 42. Thereafter, a coil 44 is selected and the leads 48, 50, 52 and 54 appropriately separated and extended outward therefrom, and the coil placed in the cavity and held down by suitable means, such as a soft probe or the like.

Figure 4:
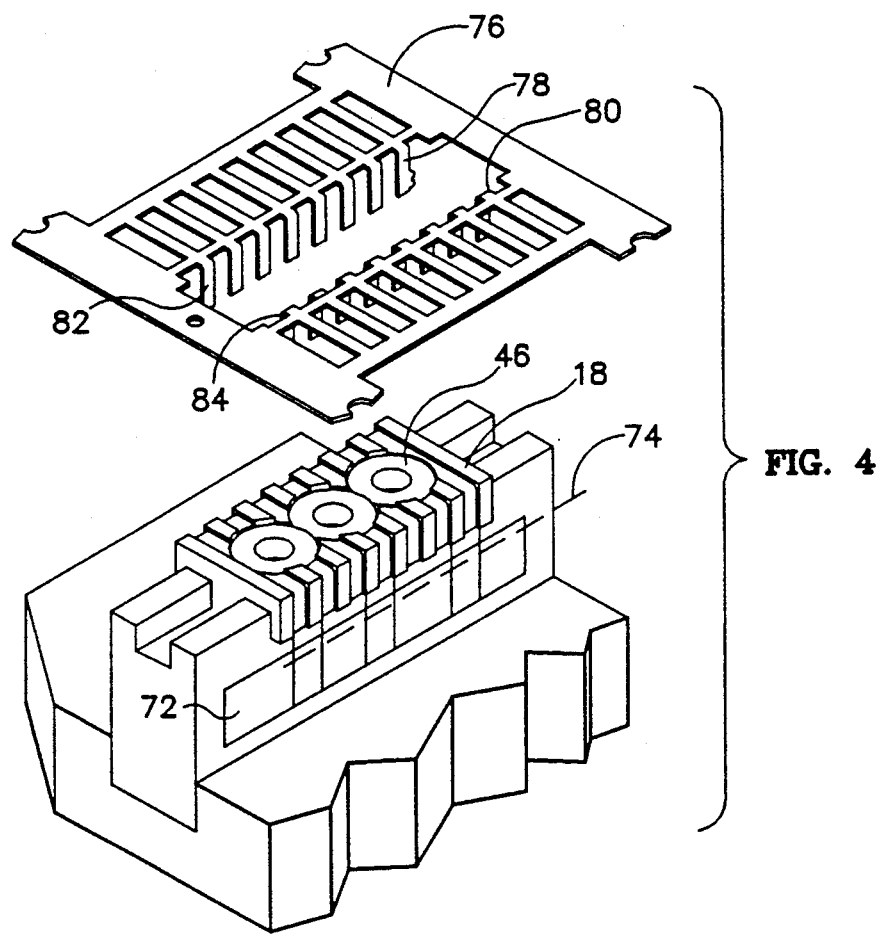
FIG. 4 is an exploded perspective view illustrating further major components and further steps in assembling the invention.

The lead wires are pulled outward and downward into the respective slots, as shown in FIG. 4, and held in place by a double sided tape member 72, as shown in FIG. 4, which has been placed below the holder on the side of the fixture. A tape may be placed on each side and the leads pulled downward and stuck to the tape, as illustrated in FIG. 4.

Figure 5:
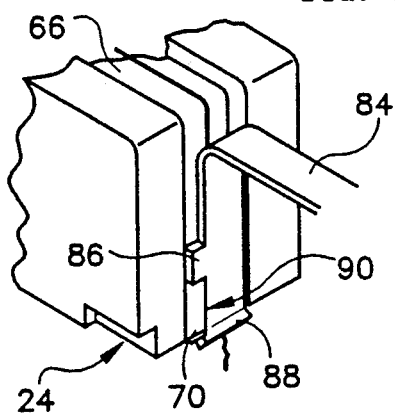
FIG. 5 is an enlarged detailed view illustrating details of terminal connection.

A lead frame 76 of the appropriate material having a plurality of lead terminals sized, positioned and preformed to fit into the plurality of slots at the side of the holder 18 is selected. The lead frame is formed as shown and the lead terminals are biased inward toward the bottoms of the slots or grooves for biased engagement with the element leads. The spring tension ranges between 0.10 oz. to 5.0 oz. The slots preferably have a depth of from two to three times the diameter of the element leads 48, 50, 52 and 54. The lead frame is formed with pairs of lead terminals 78 and 80, 82 and 84 at each end having a latch notch, as shown in FIG. 5, for cooperatively engaging the latch dogs in the respective end grooves or channels. Referring specifically to FIG. 5, for example, the lead frame terminal strip or member 84 is provided at its lower end, with a pair of fingers 86 and 88 forming a notch 90 therebetween which extends over and captures the latch members 68 and 70. The legs of each of the lead terminal members are preferably formed to require a force fit of the frame over the holder, such that the legs apply a bias toward and against the leads that extend downward along the respective slots or grooves.

Figure 6:
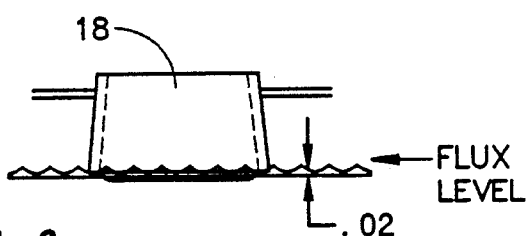
FIG. 6 is an end view illustrating the step of fluxing of terminal connections.
Figure 7:
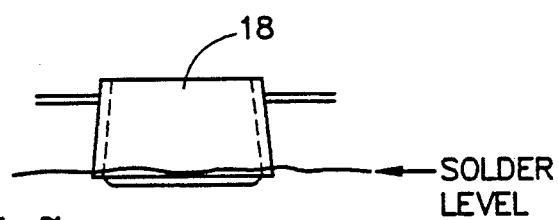
FIG. 7 is an end view illustrating the step of soldering of terminal connections.

After the lead frame 76 has been forced downward on the assembly of FIG. 4. The leads are cut by a suitable sharp blade or the like along a line 74, as shown in FIG. 4, leaving an extension thereof of on the order of 0.20 of an inch in length. The leads on both sides of the fixture are similarly cut, leaving a slight extension thereof. The entire assembly is then picked up by suitable holders, such as magnet holders, from the fixtures and dipped into a flux, as shown for example in FIG. 6, and then into a solder pot as shown in FIG. 7 to form a solder bond connection between the element lead and the lead terminals. After the solder dip, the flux is then cleaned with an isopropyl alcohol in an ultrasonic cleaner.

Figure 8:
FIG. 8 is a side view illustrating the completed package with terminal arrangement for surface mounting.

After the device is inspected for a good soldered connection, the units are then transferred to a mold wherein the slots and cavity of the holder is then filled with a suitable plastic material, covering and encapsulating the unit and forming a smooth surface rectangular box-like package as illustrated in FIG. 8. The device is preferably encapsulated in a an IC grade thermoset epoxy, such as that available under the Trademark HYSOL MG25F-0416. Thereafter, the lead frame is cut and formed in a die press or the like to cut and form the leads in a suitable form, for either surface mounting or pin mounting as desired.

Thus, from the above description, it is seen that we have a miniature electronic unit package for high density mounting and an improved method of forming an assembling such a package.

Thus, while we have illustrated and described our invention by means of specific embodiments, it is to be understood that numerous changes and modifications may be made therein without departing from the spirit and scope of the invention as defined in the appended claims.

We claim:

1. An electronic device having a plurality of leads comprising:
   a three dimensional electronic element holder of a non-conducting material having at least one cavity therein and a plurality of lead slots extending from said cavity to a base of said holder;

an electronic element mounted in said cavity and having a plurality of leads extending therefrom;

a plurality of said leads extending within said slots from said element to said base; and a plurality of lead terminals mounted on said holder and each having one end extending into one of said slots conductively connected with a lead and a free end extending outward therefrom.

2. An electronic device according to claim 1 wherein said holder has a generally rectangular box-like outer configuration and said cavity is formed in a top thereof.

3. An electronic device according to claim 2 wherein said electronic element is a microminiature inductance coil.

4. An electronic device according to claim 3 wherein:
said cavity is shaped to receive a plurality of said inductance coils; and
said lead slots extend from said cavity down both sides of said holder.

5. An electronic device according to claim 4 wherein at least one slot on each side of said holder includes latch means for latching a lead frame into position during assembly.

6. An electronic device according to claim 1 wherein:
said electronic element is a microminiature inductance coil; and
said holder has a generally rectangular box-like outer configuration and said cavity is formed of a plurality of overlapping cylindrical cavities in a top thereof for receiving a plurality of said inductance coils.

7. An electronic device according to claim 6 wherein:
said lead slots extend from said cavity down both sides of said holder; and
at least one slot on each side of said holder includes latch means for latching a lead frame into position during assembly.

8. An electronic device according to claim 7 wherein said leads and said cavities are encapsulated in a non-conductive material.

9. An electronic package including at least one electronic element having a plurality of leads connected to conducting terminals, comprising:
a three dimensional electronic element holder of a non-conducting material having a generally rectangular box-like outer configuration and at least one cavity in a top surface thereof and a plurality of lead slots extending from said cavity to a base of said holder;
an electronic element having a plurality of conductive leads mounted in said holder;
a plurality of said leads extending from said element to said base in said slots; and
a plurality of lead terminals mounted on said holder and each having one end extending into one of said slots and conductively connected by soldering with a lead and a free end extending outward therefrom.

10. An electronic package according to claim 9 wherein said electronic element is a microminiature inductance coil.

11. An electronic package according to claim 10 wherein said holder has a generally rectangular box-like outer configuration and said cavity is formed of a plurality of overlapping cylindrical cavities in a top thereof for receiving a plurality of said inductance coils.

12. An electronic package according to claim 11 wherein:
said lead slots extend from said cavity down both sides of said holder; and
at least one slot on each side of said holder includes latch means for latching a lead frame into position during assembly.

13. An electronic package according to claim 12 wherein said holder is constructed of a high temperature liquid crystal polymer.

14. An electronic package according to claim 13 wherein said holder is encapsulated in an IC grade thermo set epoxy.

15. A method of making an electronic package comprising the steps of:
selecting a three dimensional electronic element holder of a non-conducting material having a generally rectangular box-like outer configuration and at least one cavity in a top surface thereof and a plurality of lead slots extending from said cavity to a base of said holder;
selecting and mounting an electronic element having a plurality of conductive leads in said cavity in said holder;
selectively separating said leads and separately extending said leads from said element to said base in said slots; and
selecting and mounting a plurality of lead terminals on said holder with each having one end extending into one of said slots in contact with a lead and a free end extending outward therefrom.

16. A method of making an electronic package according to claim 15 wherein the steps of said electronic element is a microminiature inductance coil.

17. A method of making an electronic package according to claim 16 wherein said holder is selected to have a generally rectangular box-like outer configuration formed of a plurality of overlapping cylindrical cavities in a top thereof for receiving a plurality of said inductance coils.

18. A method of making an electronic package according to claim 17 wherein:
said holder is selected to have lead slots extending from said cavity down both sides of said holder; and
at least one slot on each side of said holder includes latch means for latching a lead frame into position during assembly.

19. A method of making an electronic package according to claim 18 wherein said holder is selected to be formed of a high temperature liquid crystal polymer.

20. A method of making an electronic package according to claim 15 further comprising the step of encapsulating said holder in an IC grade thermo set epoxy.

* * * * *